United States Patent [19]

Gordon

[11] Patent Number: 4,691,972
[45] Date of Patent: Sep. 8, 1987

[54] SOLDERLESS CONNECTION APPARATUS

[75] Inventor: Herman B. Gordon, Phoenix, Ariz.

[73] Assignee: Rogers Corporation, Rogers, Conn.

[21] Appl. No.: 872,709

[22] Filed: Jun. 10, 1986

Related U.S. Application Data

[63] Continuation-in-part of Ser. No. 707,239, Mar. 1, 1985, abandoned.

[51] Int. Cl.[4] ............................................. H01R 9/09
[52] U.S. Cl. ...................................... 439/77; 439/493
[58] Field of Search ...................... 339/17 F, 176 MF; 333/238; 174/117 F, 117 FF

[56]     References Cited
    U.S. PATENT DOCUMENTS 3,007,131 10/1961 Dahlgren et al. ................ 339/17 F
4,018,496  4/1977 Bilsback ......................... 339/17 F
4,538,865  9/1985 Wakabayashi ................... 339/17 F

OTHER PUBLICATIONS

IBM Technical Disclosure Bulletin, vol. 5, No. 11, Apr. 1963, "Cable Connector", Webb, E. J.

Primary Examiner—John McQuade
Attorney, Agent, or Firm—Fishman & Dionne

[57] ABSTRACT

A solderless connector for effecting the connection between a multi-layer flexible circuit and other electronic circuit devices is presented. A first embodiment of the present invention is characterized by wrapping separated layers of a two or more layer flexible circuit about an elastomeric resilient member such that the terminal ends of each layer are provided on one side of the resilient member. In a second embodiment of the present invention, a multi-layer flexible circuit is provided with successive steps formed in each layer wherein the terminating portions of each circuit layer have a progressively longer length. This stepped multi-layer flexible circuit is then used in conjunction with a correspondingly stepped rigid retainer plate wherein a resilient elastomeric member is positioned between the stepped flexible circuit and the steps of the rigid retainer plate such that uniform pressure is maintained on all layers during interconnection with another electronic circuit device.

19 Claims, 11 Drawing Figures

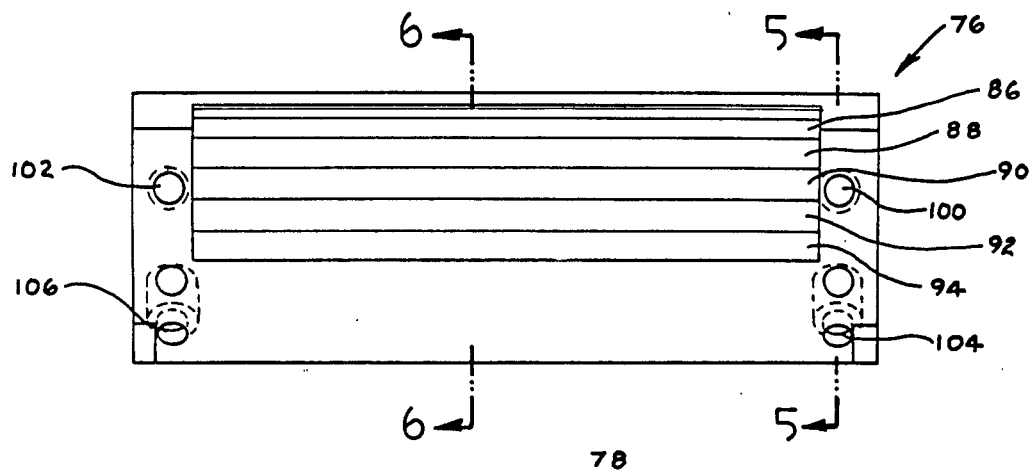
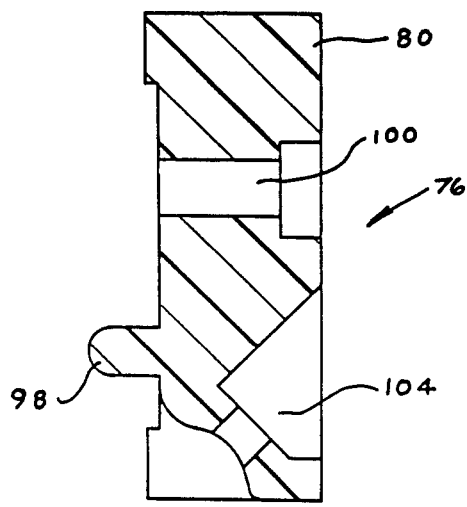
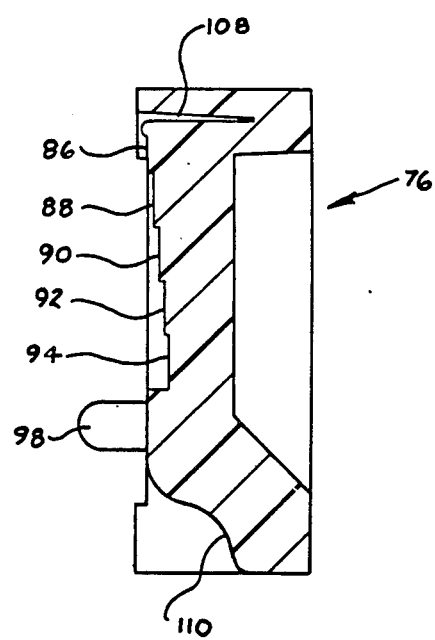

SOLDERLESS CONNECTION APPARATUS

CROSS-REFERENCE TO RELATED APPLICATION

This is a continuation-in-part of U.S. application Ser. No. 707,239 filed Mar. 1, 1985, now abandoned.

BACKGROUND OF THE INVENTION

This invention relates to a method and apparatus for interconnecting electrical circuit elements. More particularly, this invention relates to a new and improved solderless connector and method of using the same for establishing and maintaining electrical contact between multiple layer circuit devices. This invention is particularly well suited for connecting flexible circuits having two or more layers to another flexible circuit, a rigid circuit or an electronic component.

Conventional methods of interconnecting electrical or electronic circuit components consist of the use of separate connector structures and/or soldering terminals on the components to conductors which deliver current to or from the components. While generally suitable for its intended purposes, interconnecting electrical components via separate connector structures does suffer from certain drawbacks and deficiencies including high manufacturing and purchasing costs as well as increased labor time and costs during installation and connection. Similarly, soldering terminals is undesirable as the substrate which supports an exposed terminal must be able to withstand relatively high temperatures with no adverse effects. Also, soldering connections can be time consuming and therefore be labor intensive and expensive. Another problem with soldered connections is the relative difficulty in disconnecting a soldered terminal during repairs and manufacturing.

In some applications it has been found desirable to replace the use of separate connecting structures and/or soldering as a technique for use in establishing connections to flexible and other circuits. In these applications, the requisite electrical contact may be established by mechanically pressing the terminal portions of the circuit against terminal pads on the connector, device or another circuit. Such prior art pressure connections are customarily made with the aid of a solid resilient pressure applicator, such as an elastomeric member, which is placed in compression to bias at least one of the components to be electrically interconnected toward the other component to hold the terminal portions thereof in electrical contact. Such a solderless connection system is disclosed in my earlier U.S. Pat. No. 4,468,074, assigned to the assignee hereof and incorporated herein by reference.

My earlier U.S. Pat. No. 4,468,074 disclosed an apparatus wherein contact portions of a first array of conductive elements are urged against mating contacts of a second array of conductive elements by a pressure applicator comprising a resilient open-celled plastic material thereby establishing and maintaining an electrical connection therebetween. The use of such an open-celled resilient material permits a plurality of closely spaced exposed electrical conductors on or extending from a pair of substrates to be aligned and thereafter reliably pressed together; with the electrical connections being established by a requisite contact pressure applied to the substrates. The solderless connector of U.S. Pat. No. 4,468,074 may be employed to interconnect flexible circuits; to connect flexible circuits to circuits on rigid substrates; to establish connections between the leads extending from integrated circuit in a circuit pattern on a flexible or rigid circuit board; and in other applications.

While suitable for its intended purposes, the solderless connector of U.S. Pat. No. 4,468,074 relates principally to the connection of single layer flexible circuits to other circuit devices. It will be appreciated that flexible circuitry comprising multiple layers of circuits are being increasingly utilized in the electronics industry. Unfortunately, prior art solderless connector devices are not well suited for effecting interconnections involving multi-layer flexible circuits. This is because each successive layer in a multi-layer flexible circuit imparts additional stiffness and rigidity to the flexible circuit as a whole. Consequently, the elastomeric force provided by the resilient pressure applicator becomes less effective leading to unreliable electrical contact.

SUMMARY OF THE INVENTION

The above-discussed and other problems of the prior art are overcome or alleviated by the solderless connection technique and apparatus of the present invention. In accordance with the present invention, a solderless connector is provided for establishing and maintaining electrical contact between multiple layer circuit devices, particularly interconnecting a multi-layer flexible circuit device to another flexible circuit, a rigid circuit board or any other electronic component.

In a first embodiment of the present invention, a technique is provided which utilizes a two or more layer flexible circuit wherein the two conductive surfaces face inwardly and are separated by a insulating layer. Each circuit layer is then wrapped around oppositely disposed surfaces of a resilient elastomeric member such that the exposed terminal portions of the plural flexible circuits are positioned on the same plane of a single side of the elastomeric element.

In another embodiment of the present invention, a technique for effecting electrical connections between multi-layer flexible circuits having two or more layers, and other electronic circuit devices is provided. This embodiment utilizes a multi-layer flexible circuit wherein the terminal ends thereof each have different lengths; the bottom-most layer having the shortest length and the top-most layer having the longest length. Such a multi-layer flexible circuit is then used in conjunction with a rigid pressure plate which also has steps formed therein; however the steps formed in the rigid pressure plate have an opposite orientation to the steps formed in the flexible circuit layer. The solderless connector of this embodiment is assembled by providing a resilient elastomeric element between the rigid stepped pressure plate and the stepped multi-layer flexible circuit wherein the rigid pressure plate will force the terminal portions of the flexible circuit into electrical contact with another circuit device and wherein all of the stepped terminal portions of the flexible circuit will contact the other circuit device on the same plane and under a uniform pressure. Alternatively, the resilient elastomeric material may be provided between each layer in the multi-layer flexible circuit.

The above discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the several figures;

FIG. 4 is a bottom view of the rigid pressure plate of FIG. 3;

FIG. 5 is a cross-sectional elevation view along the line 5—5 of FIG. 4;

FIG. 6 is a cross-sectional elevation view along the line 6—6 of FIG. 4;

DESCRIPTION OF THE PREFERRED EMBODIMENT

Figure 1A:
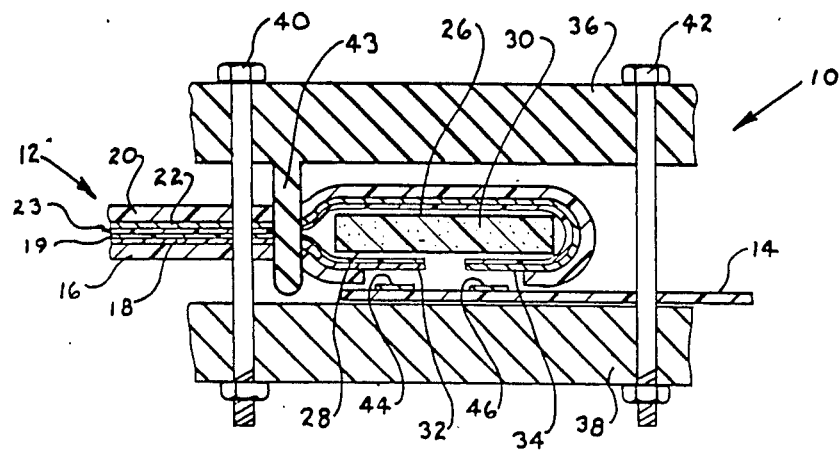
FIG. 1A is a cross-sectional elevation view of a two layer solderless connector device in accordance with the present invention.

The present invention relates to a solderless connector which is particularly well suited for connecting flexible circuits having two or more layers to other circuit devices. In FIG. 1A, a first embodiment of a solderless connector in accordance with the present invention is shown generally at 10. Solderless connector 10 is especially adapted for effecting electrical connection between a two or more layer flexible circuit shown generally at 12 and another circuit device; in this case, the circuit device being a rigid circuit board 14. In the particular illustrated example, solderless connector 10 utilizes a two layer flexible circuit having a first circuit layer and a second circuit layer. The first and second circuit layers respectively comprise a nonconductive base or substrate 16 and a cover film 19 sandwiching therebetween an electrically conductive circuit pattern means 18; and a nonconductive base or substrate 20 and a cover film 23 sandwiching therebetween an electrically conductive circuit pattern 22. The respective cover films 19 and 23 act as an insulating spacer between inwardly facing conductive circuit patterns 18 and 22 as shown in FIG. 1A. It will be appreciated that over most of the length of flexible circuit 12, the several circuit layers may be laminated together by a suitable adhesive material. However, the two circuit layers are separated at one end of the two layer flexible circuit as shown in FIG. 1. Preferably, one of the separated ends (i.e., substrate 20/pattern means 22) has a longer length than the other end. In this way, the two circuit layers may be wrapped around oppositely disposed sides 26 and 28 of a resilient elastomeric member 30 such that exposed terminal layers 32 and 34 of electrically conductive patterns 18 and 22, respectively, will be located on the same, i.e., lower, side 28 of elastomeric member 30. It will be appreciated that exposed terminal portions 32 and 34 are spacially separated to effect electrical insulation therebetween.

The two layer flexible circuit 12 used in conjunction with elastomeric member 30 as described above is well suited for use in conjunction with any conventional type of rigid clamp connector structure such as the one schematically shown in FIG. 1A. In FIG. 1A, the rigid clamp connector structure comprises upper and lower rigid plates 36 and 38 having bolts 40 and 42 or other suitable means for forcing plates 36 and 38 together. Preferably, alignment pins such as shown at 43 are provided to insure proper alignment between the flexible circuits and the rigid circuit board. In this way, the exposed terminal portions 32 and 34 of two layer flexible circuit 12 may effect electrical and mechanical contact with the respective terminal portions 44 and 46 on rigid circuit board 14. Significantly, the two layer flexible circuit 12/elastomeric pad 30 construction of the present invention provides exposed terminal patterns on the same plane. This novel structure provides uniform pressure which permits a reliable electrical contact to be made when the respective terminal portions are mechanically pressed against each other via the clamping of pressure applicator.

Figure 1B:
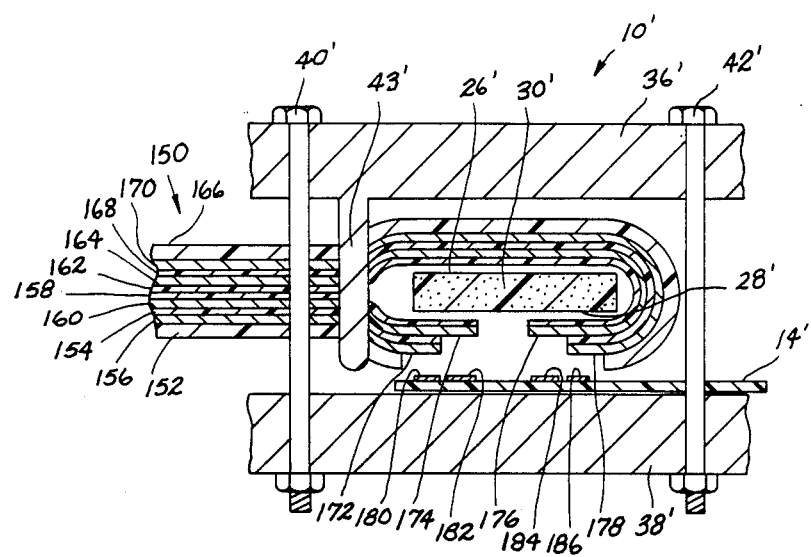
FIG. 1B is a cross-sectional elevation view, similar to FIG. 1A of a four layer solderless connector device in accordance with the present invention.

While the solderless connector 10 of FIG. 1A has been shown in conjunction with a two layer circuit, solderless connector 10 may also effect electrical connections when the multi-layer flexible circuit has more than two circuit layers such as the four layer flexible circuit generally identified at 150 in solderless connector 10' of FIG. 1B.

Solderless connector 10' utilizes a four layer flexible circuit having a first, second, third and fourth circuit layer. The first circuit layer comprises a nonconductive base or substrate 152 and a cover film 154 sandwiching therebetween an electrically conductive circuit pattern means 156. The second circuit layer comprises a nonconductive base or substrate 158 having an electrically conductive circuit pattern means 160 thereon. Similarly, the third circuit layer comprises a nonconductive base 162 having an electrically conductive circuit pattern means 164 thereon; and the fourth layer includes a nonconductive base 166 and a cover film 168 sandwiching therebetween an electrically conductive circuit pattern means 170. The respective insulating films 158 and 162 act as an insulating spacer between oppositely facing conductive circuit patterns 160 and 164, on the second and third circuit layers respectively.

It will be appreciated that over most of the length of flexible circuit 150, the several circuit layers may be laminated together by a suitable adhesive material. However, the third and fourth circuit layers are separated at one end of the four layer flexible circuit as shown in FIG. 1B. Preferably, one of the pairs of separated ends has a longer length than the other pair. In this way, the four circuit layers may be wrapped around oppositely disposed sides 26' and 28' of a resilient elastomeric member 30' such that exposed terminal layers 172, 174, 176 and 178 of electrically conductive patterns 156, 160, 164 and 170 respectively, will be located on the same, i.e., lower, side 28' of elastomeric member 30'. It will be appreciated that exposed terminal portions 172, 174, 176 and 178 are spacially separated to effect electrical insulation therebetween.

As in solderless connector 10 of FIG. 1A, the four layer flexible circuit 150 used in conjunction with elastomeric member 30' as shown in FIG. 1B is well suited for use in conjunction with any conventional type of rigid clamp connector structure such as the one schematically shown in FIG. 1B. In FIG. 1B, the rigid clamp connector structure comprises upper and lower rigid plates 36' and 38' having bolts 40' and 42' or other suitable means for forcing plates 36' and 38' together. Preferably, alignment pins such as shown at 43' are provided to insure proper alignment between the multilayer flexible circuit and the rigid circuit board. In this way, the exposed terminal portions 172, 174, 176 and 178 of four layer flexible circuit 150 may effect electrical and mechanical contact with the respective terminal portions 180, 182, 184 and 186 on rigid circuit board 14'.

While both a two and four layer circuit have been shown in FIGS. 1A and 1B respectively, it will be appreciated that any other sized flexible circuit (i.e., three, five, six, etc.) may also be used with the solderless connector of the present invention. An important feature of the multilayer flexible circuit 10 or 10' of FIGS. 1A and 1B is that at least the two outer circuit layers have opposing orientations so that the circuit pattern means thereon will be facing in the same direction subsequent to being wrapped about an elastomeric element. Another important feature of the multilayer flexible circuit of FIGS. 1A and 1B is that at least one of the circuit layers extend outwardly of the others.

Figure 2:
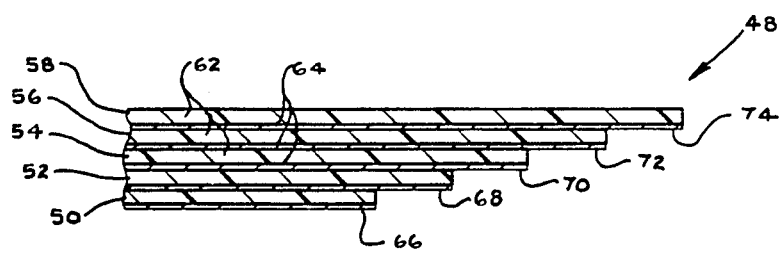
FIG. 2 is a cross-sectional elevation view of a five layer multi-layer flexible circuit used in accordance with the solderless connector of the present invention.
Figure 3:
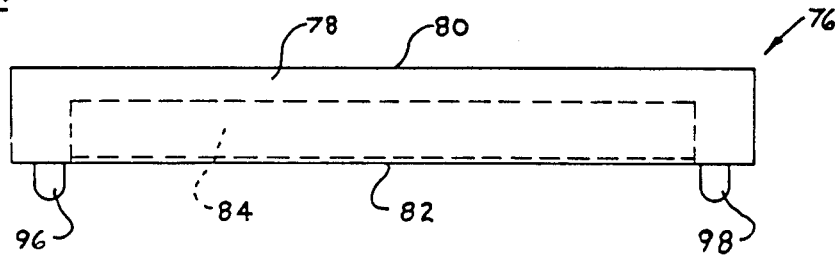
FIG. 3 is a side elevation view of a rigid pressure plate suitable for interconnecting the multi-layer flexible circuit of FIG. 2 with another circuit device in accordance with the solderless connector of the present invention.

In accordance with a second embodiment of the present invention, five layer multi-layer flexible circuit 48 is comprised of successive circuit layers 50, 52, 54, 56 and 58, each individual circuit layer including a nonconductive substrate 62 having conductive circuit pattern 64 thereon, all of which are laminated together as shown in FIG. 2. In accordance with the present invention, at one end of the multi-layer flexible circuit 48, the individual circuit layers 50–58 form a progressive step pattern. The steps are formed by providing progressively longer lengths to each individual circuit layer 50–58. Thus, circuit layer 50 has a shorter length relative to circuit layer 52 which in turn has a shorter length relative to circuit layer 54 until, eventually, the top most circuit layer 58 is reached. Accordingly, each successive circuit layer 50–58 includes an exposed terminal portion 66, 68, 70, 72 and 74. Preferably, the individual circuit layers 50–58 are not adhesively laminated together in the overlapping stepped or terminal portion 66–74 so as to maintain flexibility in those areas. Alternatively, a flexible adhesive such as R/Flex 20,000 manufactured by the Rogers Corporation may be used to laminate the overlapping terminal portions.

Referring now to FIGS. 3–6, the stepped multi-layer flexible circuit 48 of FIG. 2 is used in conjunction with a rigid pressure plate or housing generally identified at 76. Rigid pressure plate 76 is specifically adapted to be used in conjunction with a multi-layer flexible circuit device such as flexible circuit 48 shown in FIG. 2. Rigid plate 76 includes a housing 78, the housing having a top surface 80 and a bottom surface 82. Bottom surface 82 includes an opening or cavity 84 which provides access from the bottom 82 of housing 78 to the interior thereof. The upper surface of cavity 84 includes a series of steps 86, 88, 90, 92 and 94 formed therein such that the depth of cavity 84 varies from smaller (at step 86) to larger (at step 94). Rigid pressure plate 76 also includes a pair of alignment pins 96 and 98; a pair of openings 100 and 102 for receiving a bolt or other securing device; and a pair of angled apertures 104 and 106. Housing 80 further includes a flexible circuit retaining slot 108 (see FIG. 7A) and a flexible circuit board receiving ramp 110 and associated retaining clamp 112 (see FIG. 7A). Retaining clamp 112 is preferably a U-shaped clamp having a base section with two extensions on each end of the base. The extensions are respectively received in each angled aperture 104 and 106 and can be held therein by a nut (not shown). The base section of the U-shape clamp urges the flexible circuit 48 against rigid plate 76 as shown in FIG. 7A.

Figure 7A:
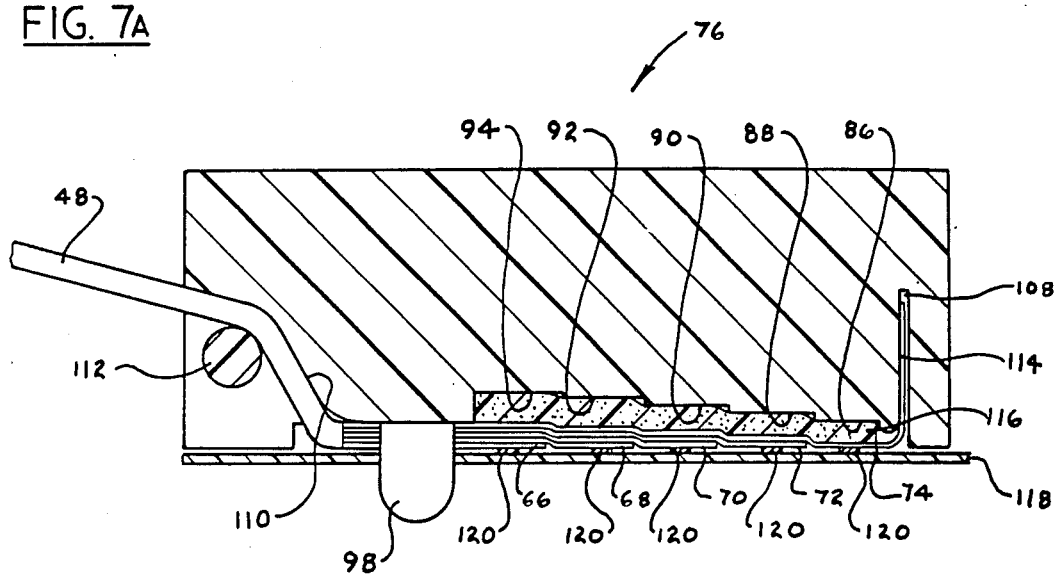
FIG. 7A is a cross-sectional elevation view of another embodiment of the multi-layer solderless connector in accordance with the present invention.

Turning now to FIG. 7A, an assembled view of the solderless connector in accordance with the present invention is shown. In FIG. 7A, a five layer flexible circuit such as the flexible circuit 48 in FIG. 2 has been mounted on the rigid connector plate 76 via insertion thereof between the flexible circuit guide ramp 110 and associated clamp 112 such that the stepped portions or terminal portions 66–74 of multi-layer circuit 48 are aligned with and disposed under steps 94–86, respectively. It will be appreciated that the end flap 114 of upper circuit layer 60 is loosely engaged within retainer slot 108. In accordance with one embodiment of the present invention, an elastomeric resilient pressure member 116 is provided between the stepped portion of cavity 84 and the terminating portions of multi-layer flexible circuit 48. Alignment pins 96 and 98 are adapted to engage the flexible circuit 48 and another circuit device, such as rigid circuit board 118 so that the conductive circuit pattern 120 of rigid circuit board 118 will be properly aligned with selected terminal portion 66–74 of multi-layer flexible circuit 48. Thereafter, bolts (not shown) or other securing means are provided through bolt holes 100 and 102 and corresponding holes in rigid circuit board 118 to effect mechanical attachment of housing 80 to rigid circuit board 118.

As the solderless connector 76 is forced into mechanical engagement with rigid circuit board 118, resilient pressure member 116 will be placed in compression to bias the respective terminal portions of flexible circuit 48 with the respective terminal portions on circuit pattern 120. It will be appreciated that the corresponding stepped configuration of cavity 84 and multi-layer circuit 48 will permit each terminal portion 66–74 of the flex circuit to be on the same plane wherein uniform pressure will be maintained at each of the respective layers. Note that the top most layer 58, i.e., terminal portion 74, (having the longest length) of flexible circuit 48 is disposed beneath the step of housing 80 having the smallest depth (i.e., step 86); while the bottom most layer 50, i.e., terminal portion 66 (having the shortest length) is disposed beneath the step of housing 80 having the largest depth (i.e., step 94).

Figure 7B:
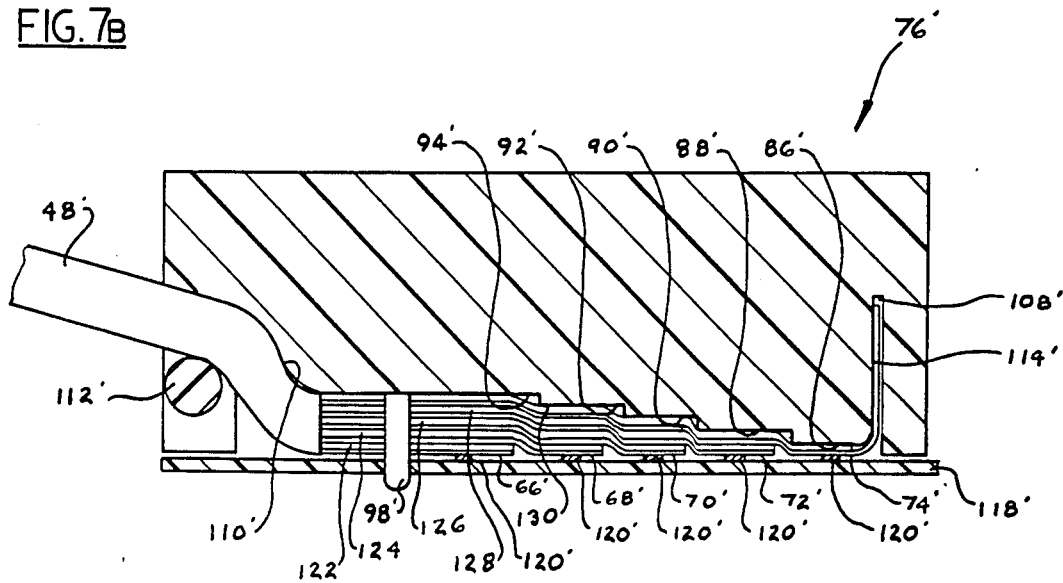
FIG. 7B is a cross-sectional elevation view of still another embodiment of the solderless connector of the present invention.

Turning now to FIG. 7B, in an alternative embodiment of the present invention, a plurality of resilient pressure members 122, 124, 126, 128 and 130 are provided between each separate layer of multi-layer flexible circuit 48'. This embodiment may be preferable to the embodiment of FIG. 7A as each terminal section may be precisely tailored in conjunction with the relative amount of resilient material needed for the particular location (i.e., it may be desirable to provide more elastomeric resilient material under a step of larger depth than under a step having a smaller depth). Another advantage is that only one flexible circuit layer is being pressed by the resilient pressure pad thereby ensuring uniform pressure; unlike the FIG. 7A embodiment wherein the pressure pad may be disposed over two or more circuit layers along the stair-step. It will be appreciated that the other structural components of FIG. 7B are identical to the structural components already discussed with regard to FIG. 7A with the addition of a prime.

Figure 8B:
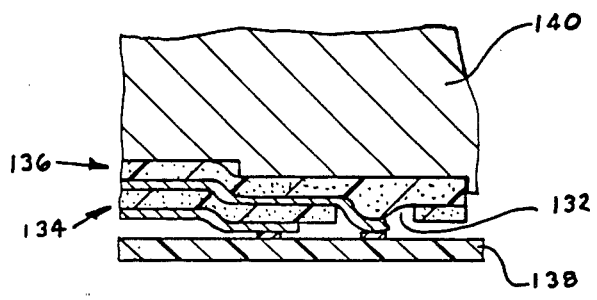
FIG. 8B is a cross-sectional elevation view along the line 8B—8B of FIG. 8A.
Figure 8A:
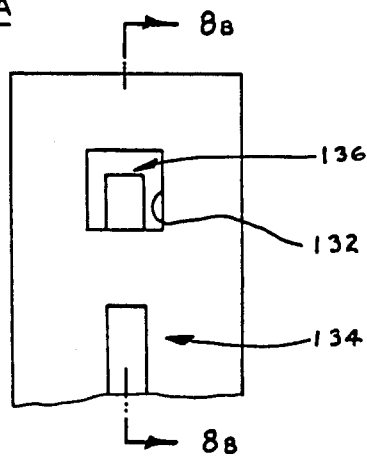
FIG. 8A is a bottom view of still another embodiment of the present invention.

Referring now to FIGS. 8A and 8B, alternatively, windows or openings 132 may be punched from a lower circuit layer 134. Window 132 will thus provide access for a portion of an adjoining layer 136 to pass therethrough and contact a circuit board 138. These windows may be provided at location as desired. Preferably, the stair step structure of the rigid pressure plate 140 will be adjusted to provide adequate pressure in effecting electrical contact.

While the above discussion of FIGS. 2-7 have been with regard to a five layer multi-layer flexible circuit and a solderless connector having five steps therein, it will be appreciated that the stepped solderless connector of the present invention suitable for interconnecting multi-layer circuits may utilize anywhere from two or more steps; the five step construction shown in the figures being an example only.

In accordance with the present invention, the material which defines the elastomeric pad 30 of FIG. 1, 116 of FIG. 7A and 122, 124, 126, 128 and 130 of FIG. 7B preferably consists of an open celled visco-elastic polymer and, in the preferred embodiment, a polyurethane foam. Particularly good results have been obtained employing a urethane formulation comprising a mixed polyester/polyether system. One open cell material suitable for use in the practice of the present invention is FCD 2200 obtainable from Rogers Corporation. This material is characterized by a compressive load deflection at 25% compression in the range of 5 to 50 psi. A resilient material for use in the present invention is preferably characterized by a compression set of less than 5%. The compression set is tested in accordance with ASTM standard D-1564 wherein a two inch square and one inch thick stack of sheets of material (about 60 mils/sheet) are compressed 50% to ½ inch thickness, the compressed material is subjected to 158° F. for 22 hours, the compression is released and the thickness is measured. The compression set of the R/Flex 8770 material after 5 hours of steam autoclaving prior to performing test ASTM D-1564 is less than 10%.

The solderless connection of the present invention is particularly adapted to effect solderless interconnection between multi-layer flexible circuits and other electronic circuit devices while maintaining uniform pressure at the several terminal portions to be connected.

It will be appreciated that the solderless connector of the present invention is well suited for interconnecting a pair of flexible circuits, a flexible circuit to a rigid circuit and a flexible circuit to an integrated circuit or other electronic component.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. In a solderless connector wherein mechanical means applies force against an elastomeric element to effect electrical contact between terminal portions of circuit devices, at least one of the circuit devices being a multi-layer flexible circuit having at least a first and second circuit layer, the improvement comprising:

said first layer of said flexible circuit including a first nonconductive substrate and a first cover film, said substrate and cover film sandwiching a first conductive pattern means therebetween;

said second layer of said flexible circuit including a second nonconductive substrate and having a second conductive pattern means thereon, said first and second conductive pattern means facing inwardly toward each other and being separated by said first cover film;

said first and second layers being bonded together to form a laminate;

said first and second pattern means respectively extending outwardly of said first and second substrates and defining first and second extended circuit portions, one of said first or second extended circuit portion having a longer length than the other first or second extended circuit portion, said first and second extended circuit portions having terminal portions at each end thereof;

said elastomeric element having oppositely disposed first and second surfaces wherein said one of said first or second extended portion is wrapped about all of said first surface and a portion of said second surface; and wherein the other of said first or second extended portion is wrapped along a portion of said second surface so that both said first and second terminal portions are electrically isolated from each other and are positioned on said second surface of said elastomeric element, said terminal portions being adapted to electrically contact another circuit device.

2. The solderless connector of claim 1 wherein said multi-layer flexible circuit includes:

at least one additional layer including a nonconductive substrate having a conductive pattern means thereon, said at least one additional layer being wrapped along said elastomeric element and including a terminal portion at the end thereof; and wherein said terminal portion of said at least one additional layer being positioned on said second surface of said elastomeric element, said additional terminal portion being electrically isolated from the other terminal portions.

3. The solderless connector of claim 1 including:

means for aligning said multi-layer circuit with another circuit device.

4. The solderless connector of claim 2 wherein:

said second layer of said flexible circuit includes a second cover film with said second conductive pattern means being sandwiched between said second nonconductive substrate and said second cover film, and said first and second conductive pattern means being spearated by said first and second cover films.

5. A solderless connector wherein mechanical means applies force against an elastomeric means to effect electrical contact between terminal portions of circuit devices, at least one of said circuit devices being a multilayer flexible circuit having at least first and second layers, the connector comprising:

a multi-layer flexible circuit;

a rigid housing, said housing defining a pair of oppositely disposed first and second surfaces, said first surface including an opening therein, said opening including an upper surface spaced from said first surface and defining a depth of said opening, said opening further including a length and a width, said opening being adapted to receive the elastomeric means and said multi-layer flexible circuit;

at least one step being formed in said upper surface of said opening along the entire length of said opening wherein said depth of said opening varies from smaller to larger in the direction of the width of said opening, said at least one step receiving said multi-layer flexible circuit;

means for applying a force to said rigid housing to compress the elastomeric means and bias the respective terminal portions of the circuit devices into electrical contact.

6. The solderless connector of claim 5 wherein said multilayer flexible circuit comprises:

at least first and second layers, said first and second layers each having terminal portions, one of the said terminal portions extending outwardly of the other of the said terminal portions to define stepped terminal portions;

said stepped terminal portions disposed beneath corresponding steps in said rigid housing, said terminal portions including exposed first conductive circuit means, said first conductive circuit means in facing relation to second conductive circuit means on another circuit device.

7. The solderless connector of claim 5 including:

elastomeric means positioned between said at least one rigid housing step and the multi-layer flexible circuit.

8. The solderless connector of claim 5 including:

elastomeric means positioned between each adjacent layer of the multi-layer flexible circuit.

9. The solderless connector of claim 6 including:

means for urging said multi-layer flexible circuit against said rigid housing.

10. The solderless connector of claim 9 wherein said urging means comprises:

a U-shaped clamp; and openings in said rigid housing to receive said U-shape clamp therein.

11. The solderless connector of claim 6 including:

a slot in said rigid housing and wherein at least one of said layers of said multi-layer circuit is positioned in said slot.

12. The solderless connector of claim 6 including:

a window provided in one of said first and second layers wherein the terminal portion of the other of said layers is disposed over said window, and wherein said terminal portion of said other layer will pass through said window upon application of a force.

13. A solderless connector wherein mechanical means applies force against an elastomeric means to effect electrical contact between terminal portions of circuit devices, at least one of said circuit devices being a multi-layer flexible circuit having at least first and second layers, the connector comprising:

a rigid housing, said housing defining a pair of oppositely disposed first and second surfaces, said first surface including an opening therein, said opening including an upper surface spaced from said first surface and defining a depth of said opening;

at least one step formed in said upper surface of said opening wherein said depth of said opening varies from smaller to larger;

a multi-layer flexible circuit, said multi-layer circuit comprising at least first and second layers, said first and second layers each having terminal portions, one of the said terminal portions extending outwardly of the other of the said terminal portions to define stepped terminal portions;

said stepped terminal portions disposed beneath corresponding steps in said rigid housing, said terminal portions including exposed conductive circuit means, said exposed conductive circuit means in facing relation to second conductive circuit means on another circuit device;

elastomeric means in contact with said multi-layer flexible circuit; and means for applying a force to said rigid housing to compress said elastomeric means and bias the respective terminal portions of the circuit devices into electrical contact.

14. The solderless connector of claim 13 including:

elastomeric means positioned between said rigid housing steps and said multi-layer flexible circuit.

15. The solderless connector of claim 13 including:

elastomeric means positioned between at least some of said layers of said multi-layer flexible circuit.

16. The solderless connector of claim 13 including:

means for urging said multi-layer flexible circuit against said rigid housing.

17. The solderless connector of claim 16 wherein said urging means comprises:

a U-shaped clamp; and openings in said rigid housing to receive said U-shape clamp therein.

18. The solderless connector of claim 13 including:

a slot in said rigid housing and wherein at least one of said layers of said multi-layer circuit is positioned in said slot.

19. The solderless connector of claim 13 including:

a window provided in one of said first and second layers wherein the terminal portion of the other of said layers is disposed over said window, and wherein said terminal portion of said other layer will pass through said window upon application of a force.

* * * * *